United States Patent
Fukuta

(10) Patent No.: US 9,444,446 B2
(45) Date of Patent: Sep. 13, 2016

(54) SWITCHING CONTROL CIRCUIT FOR TARGET SWITCHING ELEMENT

(71) Applicant: DENSO CORPORATION, Kariya, Aichi-pref. (JP)

(72) Inventor: Junichi Fukuta, Kuwana (JP)

(73) Assignee: DENSO CORPORATION, Kariya (JP)

( * ) Notice: Subject to any disclaimer, the term of this patent is extended or adjusted under 35 U.S.C. 154(b) by 126 days.

(21) Appl. No.: 14/323,562

(22) Filed: Jul. 3, 2014

(65) Prior Publication Data

US 2015/0008973 A1    Jan. 8, 2015

(30) Foreign Application Priority Data

Jul. 4, 2013  (JP) ................ 2013-140827

(51) Int. Cl.

| H03K 3/00 | (2006.01) |
|---|---|
| H03K 17/16 | (2006.01) |
| H03K 17/082 | (2006.01) |
| H03K 17/687 | (2006.01) |
| H03K 3/012 | (2006.01) |
| H03K 17/56 | (2006.01) |
| H03K 19/0175 | (2006.01) |

(52) U.S. Cl.
CPC ........ H03K 17/168 (2013.01); H03K 17/0828 (2013.01); H03K 3/012 (2013.01); H03K 17/166 (2013.01); H03K 17/56 (2013.01); H03K 17/687 (2013.01); H03K 19/017509 (2013.01)

(58) Field of Classification Search
None
See application file for complete search history.

(56) References Cited

U.S. PATENT DOCUMENTS

| 7,242,238 B2* | 7/2007 | Higashi | H03K 17/166 327/374 |
|---|---|---|---|
| 8,981,689 B2* | 3/2015 | Suzuki | H02M 1/08 318/400.17 |
| 2011/0133790 A1* | 6/2011 | Nagata | H03K 17/168 327/109 |
| 2012/0025875 A1* | 2/2012 | Fukuta | H02M 1/08 327/109 |

(Continued)

FOREIGN PATENT DOCUMENTS

| JP | 11-017508 | 1/1999 |
|---|---|---|
| JP | 2003-134797 | 5/2003 |

(Continued)

OTHER PUBLICATIONS

Office Action (2 pages) dated May 12, 2015, issued in corresponding Japanese Application No. 2013-140827 and English translation (2 pages).

*Primary Examiner* — Tuan T Lam

(74) *Attorney, Agent, or Firm* — Nixon & Vanderhye P.C.

(57) ABSTRACT

In a switching control circuit, a determiner determines whether there is one of a first type of abnormality and a second type of abnormality different therefrom in a target switching element and/or the switching control circuit. A controller controls a second switching element to close a low-impedance discharge path for discharging a control terminal of the target switching element when it is determined that there is the first type of abnormality, and disables closing of a high-impedance discharge path for discharging the control terminal while the low-impedance discharge path is closed by the second switching element. The controller controls a third switching element to close the high-impedance discharge path when it is determined that there is the second type of abnormality; and disables closing of the low-impedance discharge path while the high-impedance discharge path is closed by the third switching element.

8 Claims, 5 Drawing Sheets

(56) References Cited

U.S. PATENT DOCUMENTS

| | | | |
|---|---|---|---|
| 2012/0075753 A1* | 3/2012 | Watanabe | B60L 15/007 361/18 |
| 2012/0086496 A1* | 4/2012 | Itou | H03K 17/06 327/398 |
| 2013/0106470 A1* | 5/2013 | Takagiwa | H03K 17/168 327/109 |
| 2013/0175959 A1* | 7/2013 | Fukuta | H03K 17/166 318/400.27 |
| 2013/0181640 A1* | 7/2013 | Fukuta | H03K 17/166 318/139 |

FOREIGN PATENT DOCUMENTS

| | | |
|---|---|---|
| JP | 2012-34450 | 2/2012 |
| JP | 2012-70262 | 4/2012 |
| JP | 2012-84970 | 4/2012 |
| JP | 2012-095046 | 5/2012 |
| JP | 2013-143804 | 7/2013 |

* cited by examiner

SWITCHING CONTROL CIRCUIT FOR TARGET SWITCHING ELEMENT

CROSS REFERENCE TO RELATED APPLICATIONS

This application is based on and claims the benefit of priority from Japanese Patent Application 2013-140827 filed on Jul. 4, 2013, the disclosure of which is incorporated in its entirety herein by reference.

TECHNICAL FIELD

The present disclosure relates to switching control circuits for controlling operations of a target switching element.

BACKGROUND

There are known drivers, which are examples of such switching control circuits, applied for power devices; these power devices are widely applied for various machines. An example of these devices is disclosed in Japanese Patent Application Publication No. 2003-134797.

The Patent Publication discloses a gate driver for driving an IGBT (Insulated Gate Bipolar Transistor) as a target switching element to be controlled. The gate driver is comprised of a first MOSFET, a second MOSFET, and a soft turn-off MOSFET. The first MOSFET is connected to the gate of the target IGBT for turning on the target IGBT. The second MOSFET is connected to the gate of the IGBT for turning off the target IGBT. The first and second MOSFETs are connected to each other in series. The soft turn-off MOSFET is connected to the gate of the target IGBT, and connected to the second MOSFET in parallel thereto.

The gate driver operates normally to turn on the second MOSFET, thus turning off the target IGBT. When detecting that there is an abnormality in the target IGBT or its peripheral circuit, the gate driver turns on the soft turn-off MOSFET, thus slowly turning off the target IGBT.

SUMMARY

The gate driver disclosed in the Patent Publication may turn on the soft turn-off MOSFET without considering the type of abnormalities occurring in the target IGBT or its peripheral circuit. Thus, there is a requirement for switching control circuits, such as a gate driver set forth above, that should perform proper turning-off tasks according to type of abnormalities occurring in a target switching element, such as a target IGBT set forth above, or its peripheral circuit. That is, depending on one type of abnormalities, there may be another abnormality caused from the turn-on of the soft turn-off MOSFET.

In view of the circumstances set forth above, one aspect of the present disclosure seeks to provide switching control circuits, which are designed to address the problem set forth above.

Specifically, an alternative aspect of the present disclosure aims to provide such a switching circuit, which is capable of performing a proper turning-off task for a target switching element according to type of abnormalities occurring in the target switching element or the switching circuit.

According to a first exemplary aspect of the present disclosure, there is provided a switching control circuit for controlling one of charge and discharge of a control terminal of a target switching element to perform a corresponding one of turn-on and turn-off of the target switching element. The switching control circuit includes a first discharge path connected to the control terminal of the target switching element for discharging the control terminal thereof, the first discharge path having a first impedance. The switching control circuit includes a first switching element mounted on the first discharge path and capable of performing one of closing the first discharge path and opening the first discharge path. The switching control circuit includes a second discharge path connected to the control terminal of the target switching element for discharging the control terminal thereof. The second discharge path has a second impedance lower than the first impedance and is provided to address a first type of abnormality. The switching control circuit includes a second switching element mounted on the second discharge path and capable of performing one of closing the second discharge path and opening the second discharge path. The switching control circuit includes a third discharge path connected to the control terminal of the target switching element for discharging the control terminal thereof. The third discharge path has a third impedance higher than the first impedance and is provided to address a second type of abnormality different from the first type of abnormality. The switching control circuit includes a third switching element mounted on the third discharge path and capable of performing one of closing the third discharge path and opening the third discharge path. The switching control circuit includes a determiner that determines whether there is one of the first type of abnormality and the second type of abnormality in at least one of the target switching element and the switching control circuit. The switching control circuit includes a controller. The controller controls the second switching element to close the second discharge path when it is determined that there is the first type of abnormality. The controller disables closing of the third discharge path while the second discharge path is closed by the second switching element. The controller controls the third switching element to close the third discharge path when it is determined that there is the second type of abnormality. The controller disables closing of the second discharge path while the third discharge path is closed by the third switching element.

According to a second exemplary aspect of the present disclosure, there is provided a switching control circuit for controlling one of charge and discharge of a control terminal of a target switching element to perform a corresponding one of turn-on and turn-off of the target switching element. The switching control circuit includes a first discharge path connected to the control terminal of the target switching element for discharging the control terminal thereof, the first discharge path having a first impedance. The switching control circuit includes a first switching element mounted on the first discharge path and capable of performing one of closing the first discharge path and opening the first discharge path. The switching control circuit includes a second discharge path connected to the control terminal of the target switching element for discharging the control terminal thereof. The second discharge path has a second impedance lower than the first impedance and is provided to address a first type of abnormality. The switching control circuit includes a second switching element mounted on the second discharge path and capable of performing one of closing the second discharge path and opening the second discharge path. The switching control circuit includes a third discharge path connected to the control terminal of the target switching element for discharging the control terminal thereof. The third discharge path has a third impedance higher than the first impedance and is provided to address a second type of abnormality different from the first type of abnormality. The switching control circuit includes a third switching element mounted on the third discharge path and capable of performing one of closing the third discharge path and opening the third discharge path. The switching control circuit includes a determiner that determines whether there is one of the first type of abnormality and the second type of abnormality in at least one of the target switching element and the switching control circuit. The switching control circuit includes a first control unit that controls the second switching element to close the second discharge path when it is determined that there is the first type of abnormality. The switching control circuit includes a first disabling unit that disables closing of the third discharge path while the second discharge path is closed by the second switching element. The switching control circuit includes a second control unit that controls the third switching element to close the third discharge path when it is determined that there is the second type of abnormality. The switching control circuit includes a second disabling unit that disables closing of the second discharge path while the third discharge path is closed by the third switching element.

The switching control circuit according to each of the first and second exemplary aspects of the present disclosure controls one of the second and third switching elements to close a corresponding one of the second and third discharge paths when it is determined that there is a corresponding one of the first type of abnormality and the second type of abnormality.

While controlling one of the second and third switching elements to close a corresponding one of the second and third discharge paths, the switching control circuit disables closing of the other of the second and third discharge paths while the one of the second and third discharge paths is closed by a corresponding one of the second and third switching elements.

That is, the switching control circuit selectively closes one of the second and third discharge paths to thereby perform a proper turning-off task for the target switching element; the selected one of the second and third discharge paths is provided to address the occurrence of one of the first type of abnormality and the second type of abnormality.

In addition, while closing one of the second and third discharge paths for addressing the occurrence of a corresponding one of the first type of abnormality and the second type of abnormality, the switching control circuit prevents closing of the other of the second and third discharge paths even if a condition for the occurrence of the other of the first type of abnormality and the second type of abnormality is satisfied.

This prevents unexpected switching between the electrical conduction of the second discharge path suitable for the first type of abnormality and that of the third discharge path suitable for the second type of abnormality.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

An embodiment of the present disclosure will be described hereinafter with reference to the accompanying drawings. Modifications of the embodiment will be collectively described at the end of the DETAILED DESCRIPTION OF EMBODIMENT.

Figure 1:
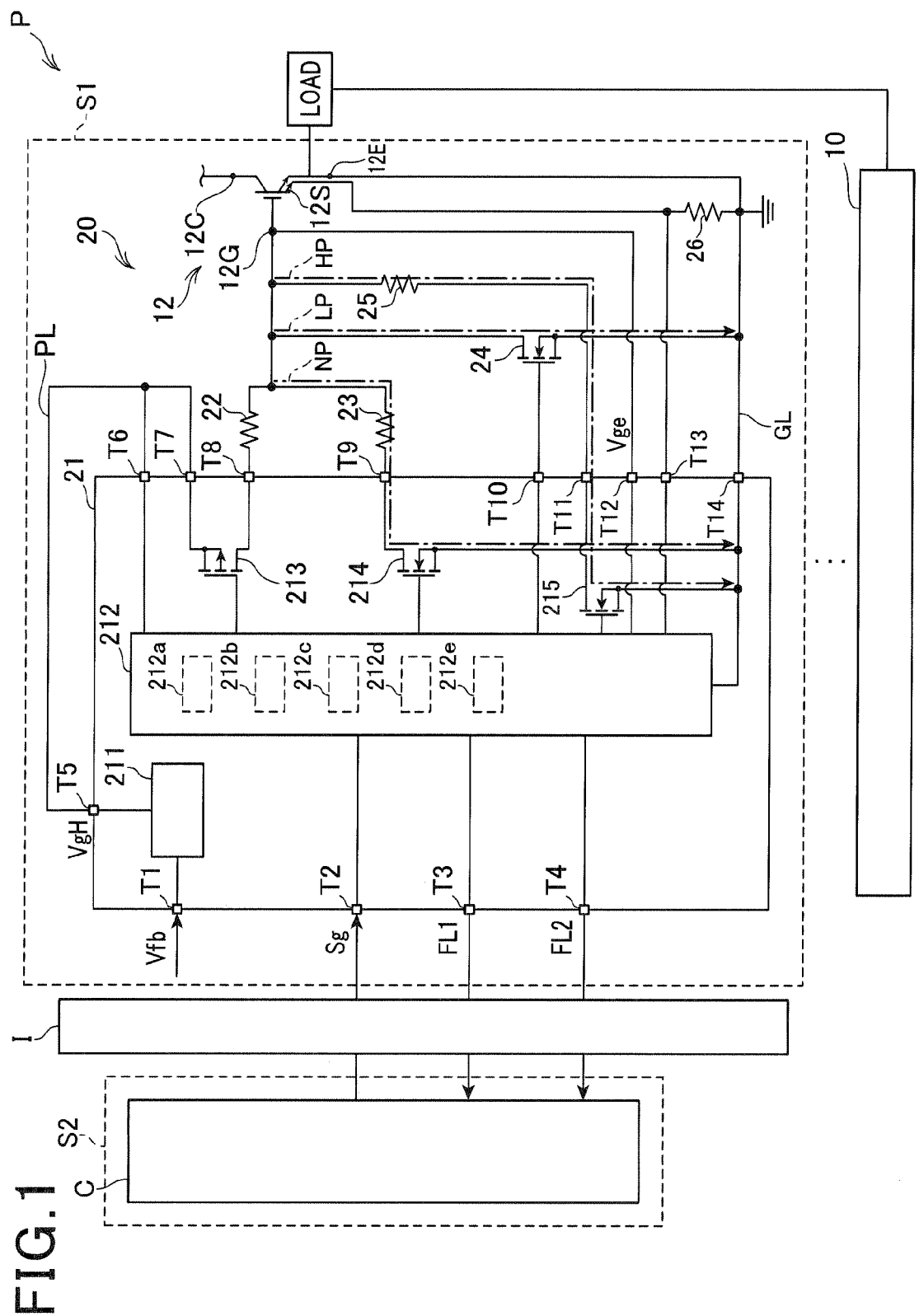
FIG. 1 is a view schematically illustrating an overall configuration of a power control unit according to an embodiment of the present disclosure.

Referring to FIG. 1, there are illustrated electric circuits 10 serving as parts of a power control unit P installed in, for example, a vehicle. In the embodiment, the vehicle incorporates therein a hybrid system. The hybrid system is composed of a motor-generator as its main engine, and an internal combustion engine as its auxiliary engine for driving the vehicle. The power control unit P is operative to control how to drive the motor-generator as a load L. For example, the power control unit P is equipped with plural pairs of electric circuits 10. Descriptions of an example of the overall structure of the power control unit P are incorporated in US Patent Application Publication No. 2012/0025875 corresponding to Japanese Patent Application Publication No. 2012-34450. That is, FIG. 1 illustrates in detail one of the electric circuits 10 of the power control unit P.

The electric circuit 10 is comprised of a target switching element 12 to be driven for controlling, for example, how to supply electrical power to the load L. A power semiconductor can be used as the target switching element 12. In the embodiment, a voltage-driven semiconductor switching element having a MOS gate structure, such as an IGBT, is used as the target switching element 12. That is, the target switching element 12 has a collector 12C serving as its input terminal, an emitter 12E serving as its output terminal, a gate 12G serving as its control terminal, and a sense terminal 12S. As well known in the technical field to which the present disclosure belongs, charging the gate 12G permits the target switching element 12 to be turned on. Discharging the gate 12G permits the target switching element 12 to be turned off. The sense terminal 12A serves to output a minute current that correlates with a collector current flowing through an electrical path of the target switching element 12 formed between the collector 12C and the emitter 12E. That is, the sense terminal 12S permits an amount of the collector current flowing through the target switching element 12 to be measured based on the minute current output from the sense terminal 12S of the target switching element 12.

The power control unit P includes a high-voltage system S1 and a low-voltage system S2. The high-voltage system S1 includes a high-voltage source and various elements that operate using a high voltage supplied from the high-voltage source. The low-voltage system S2 includes a low-voltage source and various elements that operate based on a low voltage supplied from the low-voltage source. The electric circuits 10 are installed in the high-voltage system S1.

The power control unit P includes a controller C for controlling overall operations of the hybrid system. The controller C is installed in the low-voltage system, so that the controller C operates based on a low voltage supplied from the low-voltage source.

The power control unit P includes an interface I. The interface I is configured to enable communications between the high and low voltage systems S1 and S2 while, for example, establishing electrical insulation therebetween.

The electric circuit 10 includes a switching control circuit 20 designed to control operations of the target switching element 12.

The switching control circuit 20 is comprised of a drive IC 21, a discharging resistor 23, an off-state holding switching element (SW) 24, a soft turn-off resistor 25, and a sense resistor 26.

The drive IC 21 has first to fourteenth terminals T1 to T14. The drive IC 21 is communicably connected to the low-voltage system S2 via the first to fourth terminals T1 to T4 and the interface I. Specifically, the low-voltage system S2 has, for example, a converter that converts the low voltage supplied from the low-voltage source into a voltage Vfb, and supplies the voltage Vfb to the drive IC 21 via the interface I and the first terminal T1.

The second to fourth terminals T2 to T4 allow the drive IC 21 to communicate with the controller C.

Particularly, the controller C is designed to send a drive signal Sg to the drive IC 21 via the second terminal T2 for driving the target switching element 12. For example, the drive signal Sg is a PWM signal consisting of a train of pulses having a variable duty, i.e. a duty factor, for each predetermined switching cycle for the target switching element 12. The duty factor represents a controllable on-pulse width for each predetermined switching cycle. In other words, the duty factor represents a predetermined ratio, i.e. percentage, of on duration to the total duration of each predetermined switching cycle.

The drive IC 21 is designed to output a first fail-safe signal FL1 to the controller C via the third terminal T3, and output a second fail-safe signal FL2 to the controller C via the fourth terminal T4. In other words, the drive IC 21 causes the first fail-safe signal FL1 to rise from a low level to a high level, thus outputting the first fail-safe signal FL1 to the controller C. Similarly, the drive IC 21 causes the second fail-safe signal FL2 to rise from the low level to the high level, thus outputting the second fail-safe signal FL2 to the controller C.

The first fail-safe signal FL1 represents that a first type of abnormality including an intermediate-voltage abnormality has occurred in the target switching element 12 or its peripheral circuit, that is, the switching control circuit 20.

The second fail-safe signal FL2 represents that a second type of abnormality has occurred in the target switching element 12; the second type of abnormality is different from the first type of abnormality. The first type of abnormality and the second type of abnormality will be described below.

The drive IC 21 is designed to output a voltage VgH via the fifth terminal 15 for applying the voltage VgH to the gate 12G of the target switching element 12. Specifically, there is an external power line PL disposed at the outer side of the drive IC 21. The external power line PL has a first end connected to the fifth terminal T5, and a second end connected to each of the sixth terminal T6 and the seventh terminal T7. The sixth terminal T6 serves as a terminal for detection of the voltage VgH. The seventh terminal T7 serves as an input terminal of the voltage VgH to the drive IC 21.

Each of the eighth and ninth terminals T8 and T9 is connected to the gate 12G of the target switching element 12. The charging resistor 22 is mounted on an electrical connection line between the eighth terminal 18 and the gate 12G of the target switching element 12. In other words, the eighth terminal T8 is connected to the gate 12G via the charging resistor 22.

The discharging resistor 23 is mounted on an electrical connection line between the ninth terminal 19 and the gate 12G of the target switching element 12; the electrical connection line serves as a part of a normal turn-off path NP described later. In other words, the ninth terminal 19 is connected to the gate 12G via the discharging resistor 23. The normal turn-off path NP serves as, for example, a first discharge path according to the present disclosure.

The off-state holding switching element 24 is connected between the gate 12G of the target switching element 12 and the tenth terminal T10. The off-state holding switching element, which serves as, for example, a second switching element according to the present disclosure, is designed as an N-channel MOSFET. The gate of the off-state holding switching element 24 is connected to the tenth terminal T10. The drain of the off-state holding switching element 24 is connected to the gate 12G of the target switching element 12, and the source thereof is connected to a common ground line GL having a grounded potential. Specifically, the switching control circuit 20 has a low-impedance turn-off path LP connecting between the gate 12G of the target switching element 12 and the common ground line GL via the off-state holding switching element 24. The low-impedance turn-off path LP serves as, for example, a second discharge path according to the present disclosure.

The off-state holding switching element 24 is operative to close the low-impedance turn-off path LP or open the low-impedance turn-off path LP. That is, the off-state holding switching element 24 is operative to establish electrical conduction between the gate 12G and the common ground line GL via the low-impedance turn-off path LP or shut off, i.e. breaks, the electrical conduction therebetween via the low-impedance turn-off path LP. In other words, the on-state of the off-state holding switching element 24 short-circuits the electrical path between the gate 12G and source 12E of the target switching element 12.

The low-impedance turn-off path LP has an impedance lower than that of the normal turn-off path NP described later. This aims to prevent the target switching element 12 from being erroneously turned on due to superimposition of high-frequency noise on the gate 12G based on parasitic capacitance between the collector 12C and emitter 12E of the target switching element 12 during the off state of the target switching element 12. Specifically, the high-frequency noise may charge the parasitic capacitance, resulting in the flow of a current from the collector 12C to the emitter 12E. At that time, because the impedance of the low-impedance turn-off path LP is lower than that of the normal turn-off path NP, it is possible to immediately retrieve the current flow from the target switching element 12 to the common ground line GL via the low-impedance turn-off path LP. This holds the off state of the target switching element 12.

The low-impedance turn-off path LP also serves to discharge the gate 12G if there is an abnormality, such as an intermediate-voltage abnormality, of the first type in the target switching element 12. In other words, the low-impedance turn-off path LP is provided to address the first type of abnormality.

An intermediate-voltage abnormality means an abnormality in which the gate voltage Vge at the gate 12G has been within an intermediate range between a predetermined threshold level for the gate voltage Vge and a predetermined on level for the gate voltage Vge inclusive for a preset period. The predetermined threshold level means, when the gate voltage Vge reaches the predetermined threshold level, the target switching element 12 is turned on. The predetermined on level means a level of the gate voltage Vge while the target switching element 12 is in an on state.

The eleventh and twelfth terminals are connected to the gate 12G of the target switching element 12. The twelfth terminal T12 serves a terminal for detection of the gate voltage Vge actually applied to the gate 12G.

The soft turn-off resistor 25 is connected between the gate 12G of the target switching element 12 and the eleventh terminal T11. Specifically, the switching control circuit 20 has a high-impedance turn-off path HP connecting between the gate 12G of the target switching element 12 and the common ground line GL via the soft turn-off resistor 25. The high-impedance turn-off path HP serves as, for example, a third discharge path according to the present disclosure.

The sense terminal 12S is connected to a first end of the sense resistor 26, and a second end of the sense resistor 26, which is opposite to the first end thereof, is connected to the emitter of the target switching element 12 via the common ground line GL. The fourteenth terminal T14 is connected to the grounded potential to be grounded. The thirteenth terminal 113 is connected to a connection point between the sense terminal 12S and the first end of the sense resistor 26.

Next, an example of the overall structure of the drive IC 21 will be described hereinafter.

Referring to FIG. 1, the drive IC 21 includes a series regulator 211, a drive controller 212, a charging switching element (SW) 213, a discharging switching element (SW) 214, and a soft turn-off switching element (SW) 215.

The series regulator 211 has an input terminal connected to the first terminal T1, and has an output terminal connected to the fifth terminal 15. The series regulator 211 is configured to receive the voltage Vfb via the first terminal T1 as a power supply voltage, and regulate the power supply voltage Vfb to the voltage VgH with a level, for example, lower than the level of the power supply voltage Vfb. Then, the series regulator 211 is configured to output the voltage VgH for charging the gate 12G of the to the fifth terminal T5.

The drive controller 212 is connected to the second to fourth terminals T2 to T4, and the sixth to fourteenth terminals T6 to T14. The drive controller 212 is configured to receive the drive signal Sg via the second terminal T2, and the voltage VgH via the sixth terminal T6. The drive controller 212 is also configured to receive the gate voltage Vge via the twelfth terminal 112, and a voltage, referred to as a sense voltage Vs, across the sense resistor 26 via the thirteenth terminal T13. That is, the sense voltage Vs depends on the level of the minute current output from the sense terminal 12S, that is, the collector current flowing through the target switching element 12.

The drive controller 212 is configured to control how to drive the charging switching element 213, the off-state holding switching element 214, the and the soft turn-off switching element 215 based on the received drive signal Sg and the received voltages VgH, Vge, and Vs.

The charging switching element 213 is designed as, for example, a P-channel MOSFET. The gate of the charging switching element 213 is connected to the drive controller 212, and the source of the charging switching element 213 is connected to the fifth terminal T5 via the seventh terminal T7. The drain of the charging switching element 213 is connected to the gate 12G of the target switching element 12 via the eighth terminal T8 and the charging resistor 22.

Specifically, the drive controller 212 is configured to output, based on the drive signal Sg, a drive signal, such as a PWM signal set forth above, to the gate of the charging switching element 213, thus controlling operations of the charging switching element 213. That is, turning on of the charging switching element 213 causes the voltage VgH to be applied to the gate 12G of the target switching element 12 via the external power line PL and a charging line; the charging line includes the seventh terminal T7, the charging switching element 213, the eighth terminal T8, and the charging resistor 22. This charges the gate 12G of the target switching element 12 via the charging line.

The discharging switching element 214, which serves as, for example, a first switching element according to the present disclosure, is designed as an N-channel MOSFET. The gate of the discharging switching element 214 is connected to the drive controller 212, and the source of the discharging switching element 214 is connected to the common ground line GL. The drain of the discharging switching element 214 is connected to the gate 12G of the target switching element 12 via the ninth terminal T9 and the discharging resistor 23.

Specifically, the drive controller 212 is configured to output, based on the drive signal Sg, a drive signal, such as a PWM signal set forth above, to the gate of the discharging switching element 214, thus controlling operations of the discharging switching element 214.

The discharging switching element 214 is disposed on the normal turn-off path NP. The discharging switching element 214 is operative to close the normal turn-off path NP or open the normal turn-off path NP. That is, the discharging switching element 214 is operative to select one of: electrical conduction between the gate 12G and the common ground line GL via the normal turn-off path NP; and shutoff of the electrical conduction therebetween.

The normal turn-off path NP serves as an electrical path for discharging the gate 12G of the target switching element 12 during an off state of the discharging switching element 214 while the switching control circuit 20 and the target switching element 12 operate normally. Specifically, the normal turn-off path NP is defined from the gate 12G of the target switching element 12 up to the common ground line GL via the discharging resistor 23, the ninth terminal T9, the discharging switching element 214, and the fourteenth terminal T14.

The soft turn-off switching element 215, which serves as, for example, a third switching element according to the present disclosure, is designed as an N-channel MOSFET. The gate of the soft turn-off switching element 215 is connected to the drive controller 212, and the source of the soft turn-off switching element 215 is connected to the common ground line GL. The drain of the soft turn-off switching element 215 is connected to the gate 12G of the target switching element 12 via the eleventh terminal T11 and the soft turn-off resistor 25.

Specifically, the drive controller 212 is configured to output a drive signal, such as a PWM signal set forth above, to the gate of the soft turn-off switching element 215, thus controlling operations of the soft turn-off switching element 215.

Specifically, the soft turn-off switching element 215 is disposed on the high-impedance turn-off path HP. That is, the soft turn-off switching element 215 is operative to close the high-impedance turn-off path HP or open the high-impedance turn-off path HP. That is, the soft turn-off switching element 215 is operative to select one of: electrical conduction between the gate 12G and the common ground line GL via the high-impedance turn-off path HP; and shutoff of the electrical conduction therebetween.

The high-impedance turn-off path HP serves as an electrical path for discharging the gate 12G of the target switching element 12 when there is an abnormality of the second type in the switching control circuit 20 and/or the target switching element 12. In other words, the high-impedance turn-off path HP is provided to address the second type of abnormality.

Particularly, the high-impedance turn-off path HP is designed to be higher in impedance than the normal turn-off path NP. The reason is as follows:

Specifically, the first type of abnormality, such as the intermediate-voltage abnormality, needs a task to relatively rapidly discharge the target switching element 12, in other words, needs a task to discharge the target switching element 12 via the low-impedance turn-off path Lp.

In contrast, the second type of abnormality, such as an overcurrent flowing through the target switching element 12 or an abnormality of the voltage VgH to be applied to the gate 12G of the target switching element 12, needs a task to relatively slowly discharge the target switching element 12. In other words, the second type of abnormality needs a task to discharge the target switching element 12 via the high-impedance turn-off path Hp.

The aforementioned structures of the normal turn-off path NP, the low-impedance turn-off path LP, and the high-impedance turn-off path HP have been described as an example. The applicant has already filed various structures of these normal turn-off path NP, low-impedance turn-off path LP, and high-impedance turn-off path HP. For example, a structural example of these normal turn-off path NP, low-impedance turn-off path LP, and high-impedance turn-off path HP is disclosed in the US Patent Application Publication No. 2012/0025875 corresponding to the Japanese Patent Application Publication No. 2012-34450. If the patent practices of the US allow incorporation of the disclosure of the US Patent Application Publication No. 2012/0025875, the disclosure of the US Patent Application Publication No. 2012/0025875 constitutes a part of the present application, and can be incorporated therein if necessary.

Particularly, the drive controller 212 includes a first module 212a. The first module 212a receives the gate voltage Vge input to the drive controller 212 via the twelfth terminal T12, the sense voltage Vs input to the drive controller 212 via the thirteenth terminal T13, and the voltage VgH input thereto via the sixth terminal T6. Then, the first module 212a determines, based on, for example, the gate voltage Vge, the sense voltage Vs input thereto via the thirteenth terminal T13, and the voltage VgH, whether:

there is an abnormality of the first type, such as the intermediate-voltage abnormality, in the target switching element 12 or the switching control circuit 20; or there is an abnormality of the second type in the target switching element 12 or the switching control circuit 20.

That is, the first module 212a serves as, for example, a determiner that determines whether there is one of the first type of abnormality and the second type of abnormality in at least one of the target switching element 12 and the switching control circuit 20.

For example, the first module 212a determines that there is an abnormality of the first type when the gate voltage Vge has been within the intermediate range for a predetermined threshold period. For example, the first module 212a also determines that there is an abnormality of the second type when a level of the collector current exceeds a predetermined threshold level. The first module 212a further determines that there is an abnormality of the second type when the voltage VgH becomes equal to lower than a preset level V0.

The drive controller 212 includes a second module 212b that turns on the off-state holding switching element 24 to close the low-impedance turn-off path LP when it is determined that there is an abnormality of the first type in the target switching element 12 or the switching control circuit 20. This turns off the target switching element 12. That is, the second module 212b serves as, for example, a first control unit that controls the off-state holding switching element 24 to close the low-impedance turn-off path LP when it is determined that there is the first type of abnormality.

The drive controller 212 includes a third module 212c that turns on the soft turn-off switching element 215 to close the high-impedance turn-off path HP when it is determined that there is an abnormality of the second type in the target switching element 12 or the switching control circuit 20. In other words, the third module 12c performs soft turn-off of the target switching element 12. That is, the third module 212c serves as, for example, a second control unit that controls the soft-turnoff switching element 215 to close the high-impedance turn-off path HP when it is determined that there is the second type of abnormality.

The drive controller 212 includes a fourth module 212d that disables establishment of electrical conduction of the high-impedance turn-off path HP while establishing conduction of the low-impedance turn-off path LP due to detection of an abnormality of the first type. That is, the fourth module 212d serves as, for example, a first disabling unit that disables closing of the high-impedance turn-off path HP while the low-impedance turn-off path LP is closed by the off-state holding switching element 24.

The drive controller 212 includes a fifth module 212e that disables establishment of electrical conduction of the low-impedance turn-off path LP while establishing electrical conduction of the high-impedance turn-off path HP due to detection of an abnormality of the second type. That is, the fifth module 212e serves as, for example, a second disabling unit that disables closing of the low-impedance turn-off path LP while the high-impedance turn-off path HP is closed by the soft turn-off switching element 215.

Each of the modules 212a to 212e can be designed as a functional module, such as a hardware module, a software module, or the combination of hardware and software modules.

Figure 2:
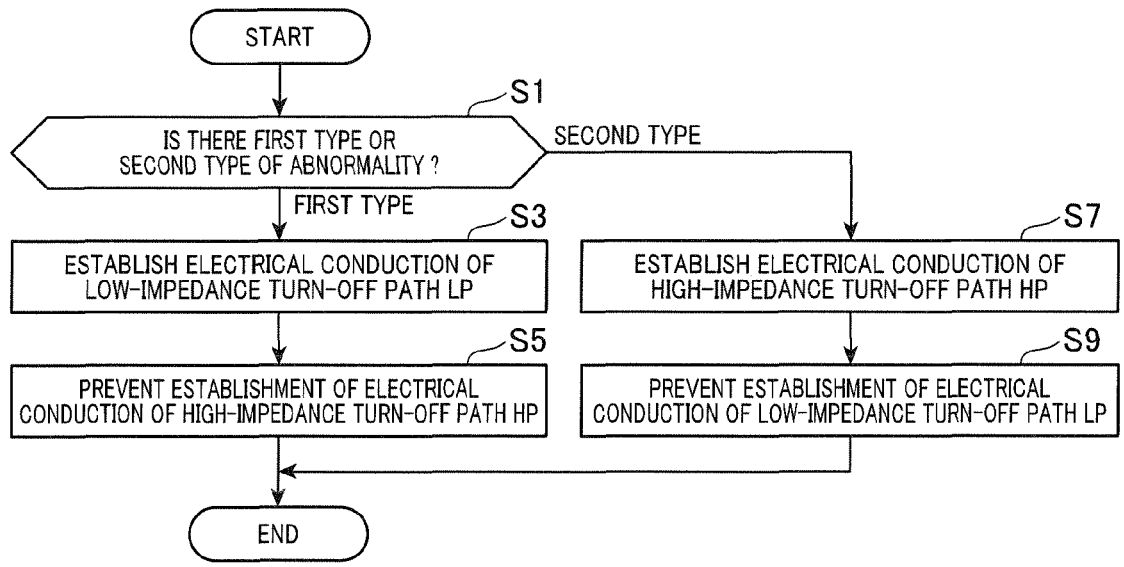
FIG. 2 is a flowchart schematically illustrating an example of operations of a switching control circuit illustrated in FIG. 1.

Next, operations of the switching control circuit 20 according to the embodiment and advantages achieved thereby will be briefly described hereinafter with reference to FIG. 2.

When performing turn-off of the target switching element 12 based on the drive signal Sg supplied from the controller C, the drive controller 212 turns off the discharging switching element 214 when it is determined that there are no abnormalities in the target switching element 12 and the switching control circuit 20. This establishes electrical conduction of the normal turn-off path NP, discharging the gate 12G of the target switching element 12.

When determining that there is an abnormality of the first type without determining there are no abnormalities of the second type (FIRST TYPE in step S1), the drive controller 212 outputs the first fail-safe signal FL1 to the controller C via the third terminal T3 and the interface I in step S3.

In step S3, the drive controller 212 controls the off-state holding switching element 24 to establish electrical conduction of the low-impedance turn-off path LP in step S3. That is, the drive controller 212 turns on the off-state holding switching element 24 to thereby closing the low-impedance turn-off path LP. For example, when receiving the first fail-safe signal FL1, the controller C is operative to perform a fail-safe task that, for example, maintains the drive signal Sg at an off level, resulting in maintaining the target switching element 12 in the off state.

During the electrical conduction of the low-impedance turn-off path LP, the drive controller 212 prevents establishment of electrical conduction of the high-impedance turn-off path HP, in other words, prevents turn-on of the soft turn-off switching element 215 even if the drive controller 212 determines that there is an abnormality included in the second type of abnormality in step S5.

In step S5, the drive controller 212 disables the high-impedance turn-off path HP from being brought into electrical conduction even if the drive controller 212 determines that one or more conditions indicative of the occurrence of an abnormality included in the second type of abnormality are met in step S5.

On the other hand, when determining that there is an abnormality of the second type without determining there are no abnormalities of the first type (SECOND TYPE in step S1), the drive controller 212 outputs the second fail-safe signal FL2 to the controller C via the fourth terminal T4 and the interface I in step S7.

In step S7, the drive controller 212 controls the soft turn-off switching element 215 to establish electrical conduction of the high-impedance turn-off path HP in step S7. That is, the drive controller 212 turns on the soft turn-off switching element 215 to thereby close the high-impedance turn-off path HP.

For example, when receiving the second fail-safe signal FL2, the controller C is operative to perform a fail-safe task that, for example, maintains the drive signal Sg at an off level, resulting in maintaining the target switching element 12 in the off state.

During the electrical conduction of the high-impedance turn-off path HP, the drive controller 212 prevents establishment of electrical conduction of the low-impedance turn-off path LP, in other words, prevents turn-on of the soft turn-off switching element 24 even if the drive controller 212 determines that there is an abnormality included in the first type of abnormality in step S9.

In step S9, the drive controller 212 disables the low-impedance turn-off path LP from being brought into electrical conduction even if the drive controller 212 determines that one or more conditions indicative of the occurrence of an abnormality included in the first type of abnormality are met in step S9.

As described above, the switching control circuit 20 according to the embodiment performs a first turn-off operation of the target switching element 12 using the low-impedance turn-off path LP when determining that there is an abnormality of the first type.

While performing the first turn-off operation of the target switching element 12, the switching control circuit 20 disables execution of a second turn-off operation of the target switching element 12. The second turn-off operation is to turn off the target switching element 12 using the high-impedance turn-off path HP. Specifically, even if it is determined that there is an abnormality of the second type of abnormality, the switching control circuit 12 continuously performs the first turn-off operation without performing the second turn-off operation.

This configuration reduces unexpected interruption of one of the first and second turn-off operations and/or unexpected switching between the first and second turn-off operations. This results in preventing the occurrence of problems due to unexpected interruption of and/or unexpected switching between the first and second turn-off operations.

Next, operations of the switching control circuit 20 according to the embodiment and advantages achieved thereby will be described in detail hereinafter with reference to FIGS. 3 and 4.

In the embodiment, the first type of abnormality may occur mainly due to: a first factor of the discharging switching element 214 being erroneously not turned on; a second factor of the discharging switching element 214 being erroneously maintained in the on state, i.e., conductive state; and/or a third factor of the seventh and eighth terminals T7 and T8 being short-circuited. The third factor may result in the charging switching element 213 being erroneously maintained in the on state, i.e. conductive state. In other words, the third factor represents that the charging switching element 213 is short-circuited.

When the drive signal Sg is changed from a low level corresponding to an off state (OFF) to a high level corresponding to an on state (ON), the drive controller 212 turns off each of the off-state holding switching element 24, the discharging switching element 214, and the soft turn-off switching element 215 substantially in synchronization with each other.

For example, immediately after the turn-off of these switching elements 24, 214, and 215, the drive controller 212 turns on the charging switching element 213. That is, the drive controller 212 turns on the charging switching element 213 while the off-state holding switching element 24, the discharging switching element 214, and the soft turn-off switching element 215 is reliably in the off state. The turn-on of the charging switching element 213 results in turn-on of the target switching element 12 set forth above.

Thereafter, when the drive signal Sg is changed from the on level (ON) to the off level (OFF), the drive controller 212 turns off the charging switching element 213, and immediately thereafter, turns on the discharging switching element 214.

Specifically, when no abnormalities occur in the target switching element 12 and the switching control circuit 20, the drive controller 212 turns off the charging switching element 213 first, and turns on the discharging switching element 214 next. The drive controller 212 controls drive of each of the off-state holding switching element 24 and soft turn-off switching element 215 depending on how an abnormality occurs in the target switching element 12 or the switching control circuit 20. In other words, the drive controller 212 controls drive of each of the off-state holding switching element 24 and soft turn-off switching element 215 depending on how to rise the first fail-safe signal FL1 or the second fail-safe signal FL2 from the low level to the high level.

First, operations of the switching control circuit 20 if the intermediate-voltage abnormality as an abnormality of the first type occurs in the target switching element 12 or the switching control circuit 20 due to the third factor, i.e.

short-circuit of the charging switching element 213 will be described hereinafter with reference to FIG. 3.

Assuming that no abnormalities occur in the target switching element 12 or the switching control circuit 20 at time t21 when the drive signal Sg is changed from the high level to the low level, the drive controller 212 turns on the discharging switching element 214 immediately after trying to turn-off of the charging switching element 213. This causes the gate voltage Vge to gradually fall.

However, because the charging switching element 213 is erroneously short-circuited, the gate voltage Vge falls down to a preset level between the intermediate range between the threshold level and the on level at time t21a, and continues to lie within the intermediate range (see after the time t21a).

At time t22, when the gate voltage Vge has been within the intermediate range for the predetermined threshold period since the time t21a, the drive controller 212 determines that a condition indicative of the occurrence of the first type of abnormality is satisfied at the time t22. Then, the drive controller 212 determines that there is an abnormality of the first type, and causes the first fail-safe signal FL1 to rise from the low level to the high level, thus informing the controller C of the occurrence of the first type of abnormality based on the first fail-safe signal FL1.

At the time t22, the drive controller 22 also performs a task in response to the occurrence of the first type of abnormality, thus turning off the off-state holding switching element 24. This establishes electrical conduction of the low-impedance turn-off path LP, thus immediately discharging the gate 12G of the target switching element 12. This results in the gate voltage Vge falling relatively rapidly down to a zero level at time t22a.

On the other hand, short-circuit of the charging switching element 213 causes the output voltage VgH of the series regulator 211 to decrease. When the output voltage VgH becomes equal to or lower than the preset level V0 at time t23, a condition indicative of the occurrence of an abnormality of the voltage VgH to be applied to the gate 12G of the target switching element 12, i.e. a power-supply abnormality, of the second type is satisfied.

At the time t23, if the drive controller 212 caused the second fail-safe signal FL2 to rise, the drive controller 212 would cause the first fail-safe signal FL1 to fall (see dashed-dotted line DL1 in FIG. 3) because it is necessary to open the low-impedance turn-off path LP while the high-impedance turn-off path HP is closed. This would switch the on state of the off-state holding switching element 24 to the off state (see the DL1), and the off state of the soft turn-off switching element 215 to the on state (see dashed-dotted line DL2 in FIG. 3).

The turn-off of the off-state holding switching element 24 would shut off the electrical conduction of the low-impedance turn-off path LP, and the turn-on of the soft turn-off switching element 215 would establish the electrical conduction of the high-impedance turn-off path HP. This would result in an unexpected increase of the gate voltage Vge (see dashed-dotted line DL3 in FIG. 3).

Figure 3:
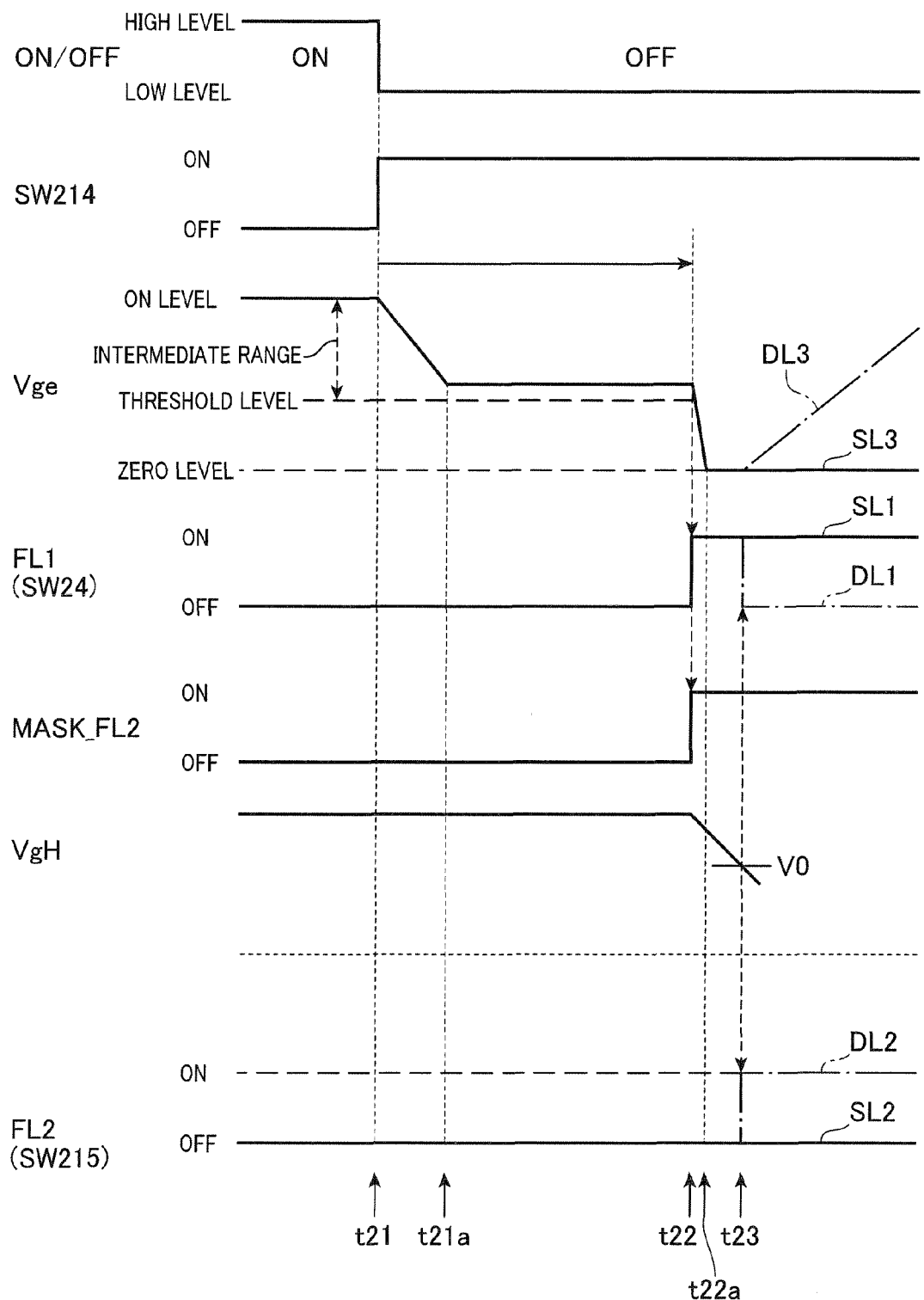
FIG. 3 is a timing chart schematically illustrating operations of the switching control circuit if an inter mediate-voltage abnormality as one of a first type of abnormality occurs in a target switching element or the switching control circuit according to the embodiment.

In contrast, the drive controller 212 according to the embodiment prevents rising of the second fail-safe signal FL2 while the first fail-safe signal FL1 is rising, thus maintaining the off-state holding switching element 24 in the on state and maintaining the soft turn-off switching element 215 in the off state (see solid lines SL1 and SL2 in FIG. 3). That is, the drive controller 212 masks, i.e. disables, detection of abnormalities of the second type while the first type of abnormality is being detected (see reference character MASK_FL2 in FIG. 3). In other words, while the first type of abnormality is being detected, the drive controller 212 prevents the high-impedance turn-off path HP from being electrically conductive. This results in prevention of an unexpected increase of the gate voltage Vge (see solid line SL3 in FIG. 3).

Next, operations of the switching control circuit 20 if an abnormality included in the second type of abnormality, such as the occurrence of an overcurrent, occurs in the target switching element 12 or the switching control circuit 20 will be described hereinafter with reference to FIG. 4.

It is assumed that the drive signal Sg is in the high level (ON), so that the charging switching element 213 is in the on state with the switching elements 24, 214, and 215 being in the off state at time t31.

At the time t31, the drive controller 212 determines that there is an abnormality, such as an overcurrent, of the second type based on change of the sense voltage Vs. Then, the drive controller 212 causes the second fail-safe signal FL2 to rise from the low level to the high level, thus informing the controller C of the occurrence of the second type of abnormality based on the second fail-safe signal FL2.

At the time t31, the drive controller 22 also performs, in response to the occurrence of the second type of abnormality, a task that turns off the charging switching element 213, and immediately thereafter, turns on the soft turn-off switching element 215. This establishes electrical conduction of the high-impedance turn-off path HP, thus slowly discharging the gate 12G of the target switching element 12. This results in a collector-emitter voltage Vce starting to rise, and the gate voltage Vge rising relatively gradually at the time t31.

After the time t31, when the drive signal Sg is changed from the high level (ON) to the low level (OFF), the drive controller 212 turns off the charging switching element 213, and immediately thereafter, turns on the discharging switching element 214 at time t32.

If the gate voltage Vge decreases more slowly, so that the gate voltage Vge has been within the intermediate range for the predetermined threshold period, the condition indicative of the occurrence of the first type of abnormality may be satisfied at the time t33. At that time, if the drive controller 212 caused the first fail-safe signal FL1 to rise, the drive controller 212 would turn on the off-state holding switching element 24, thus establishing electrical conduction of the low-impedance turn-off path LP (see dashed-dotted line DL10 in FIG. 4). This would cause the gate 12G of the target switching element 12 to be rapidly discharged (see dashed-dotted line DL11), so that the gate voltage Vge would rapidly fall, and a rapid surge would occur in the collector-emitter voltage Vce due to the rapid change of the gate voltage Vge (see dashed-dotted line DL12).

Figure 4:
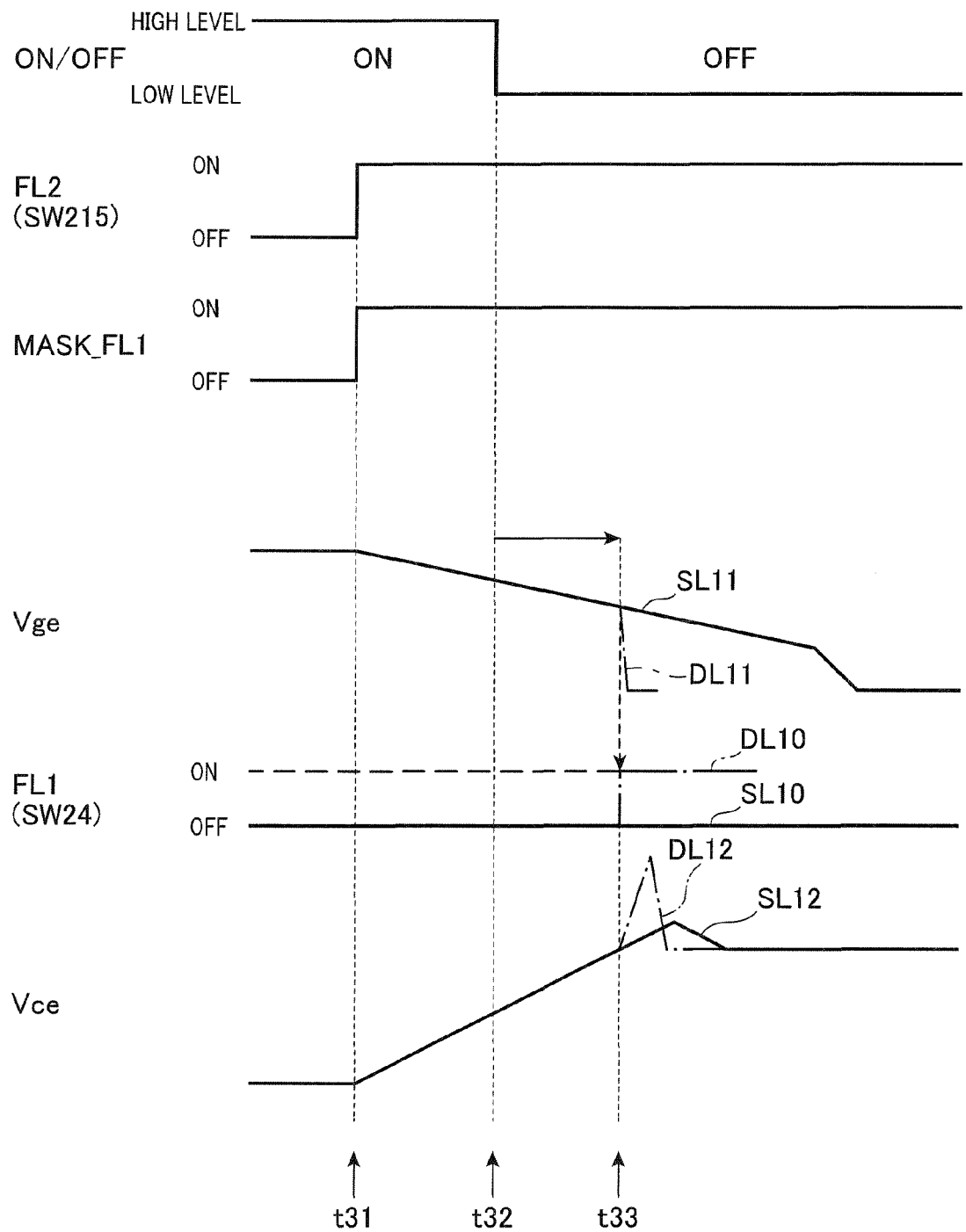
FIG. 4 is a timing chart schematically illustrating operations of the switching control circuit if an abnormality of a second type occurs in the target switching element or the switching control circuit according to the embodiment.

In contrast, the drive controller 212 according to the embodiment prevents rising of the first fail-safe signal FL1 while the second fail-safe signal FL2 is rising, thus maintaining the off-state holding switching element 24 in the off state (see solid line SL10 in FIG. 4). That is, the drive controller 212 masks, i.e. disables, detection of abnormalities included in the first type of abnormality while the second type of abnormality is being detected (see reference character MASK_FL1 in FIG. 4). In other words, while the second type of abnormality is being detected, the drive controller 212 prevents the low-impedance turn-off path LP from being electrically conductive. This results in prevention of a rapid decrease of the gate voltage Vge and the occurrence of a rapid surge in the collector-emitter voltage Vce (see solid lines SL11 and SL12 in FIG. 4).

Figure 5:
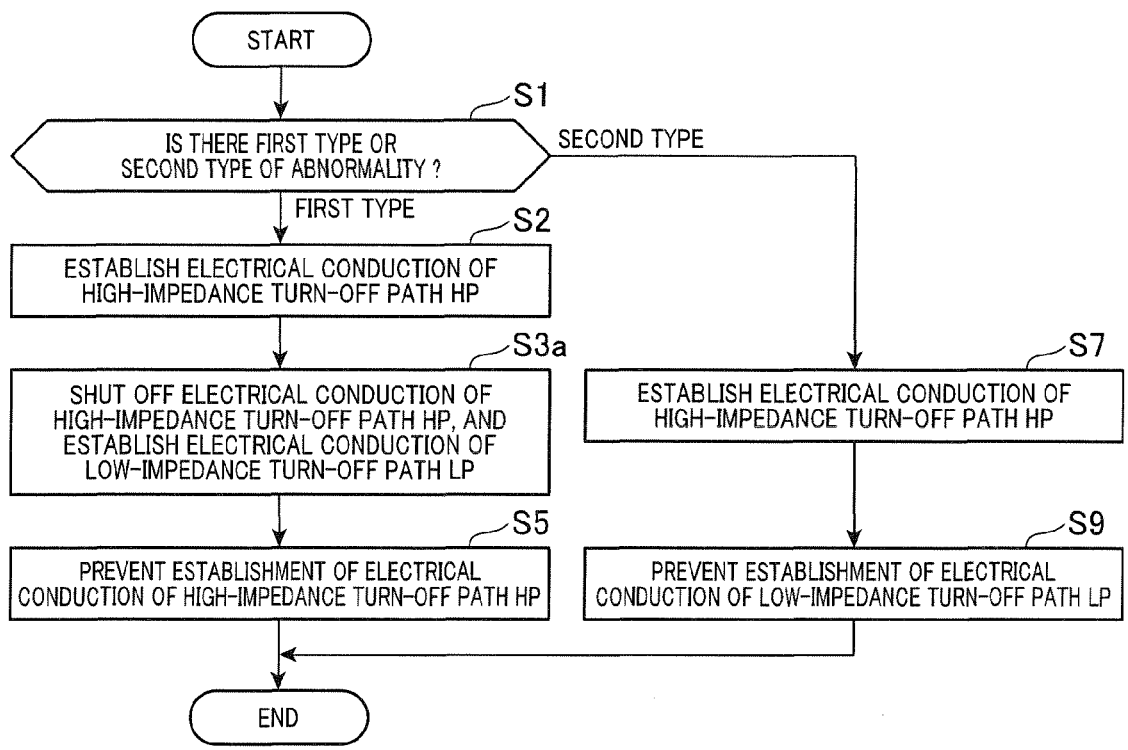
FIG. 5 is a flowchart schematically illustrating an example of operations of the switching control circuit according to a typical modification of the embodiment.

Next, typical modification of the embodiment of the present disclosure will be described hereinafter. In the descriptions of the typical modifications, redundant descriptions of like parts between the embodiment and each modification, to which like referenced characters are assigned, are omitted or simplified. In other words, in each modification, descriptions of regarding like parts between the embodiment and the corresponding modification, which have been disclosed in the embodiment, can be incorporated by reference. The following typical modifications are some of all considerable modifications of the embodiment, and therefore, the following typical modifications cannot limit the scope of the present disclosure. Some of the features of the embodiment and all or some of the features of the following typical modifications can be cooperatively combined with each other within the scope of the present disclosure unless there are technical contradictions in the combinations When there is an abnormality of the first type, the drive controller 212 can turn on the soft turn-off switching element 215 to establish electrical conduction of the high-impedance turn-off path HP for a preset period, thus gradually discharging the gate 12G of the target switching element 12 up to a preset level (see step S2 in FIG. 5). After lapse of the preset period, the drive controller 212 can turn off the soft turn-off switching element 215 to shut off electrical conduction of the high-impedance turn-off path HP, and turn of the off-state holding switching element 24 to establish electrical conduction of the low-impedance turn-off path LP (see step S3a in FIG. 5). This modification makes it possible to effectively prevent the occurrence of a surge in, for example, the collector-emitter voltage Vce due to rapid change of the gate voltage Vge.

As each of the switching elements 24, 213, 214, and 215, an MOSFET is used, but a bipolar transistor can be used.

The sense terminal 12S and the sense resistor 26 serve as, for example, a unit for measuring the collector current flowing through the target switching element 12, but the present disclosure is not limited thereto. Specifically, for example, a voltage measuring unit, such as a voltage sensor, for measuring the collector-emitter voltage Vce of the target switching element 12 can be installed in the switching control circuit 20 in place of or in addition to the sense terminal 12S and the sense resistor 26. This makes it possible to measure the collector current based on the measured collector-emitter voltage of the target switching element 12.

A MOSFET can be used as the target switching element 12.

While the illustrative embodiment of the present disclosure has been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A switching control circuit for controlling one of charge and discharge of a control terminal of a target switching element to perform a corresponding one of turn-on and turn-off of the target switching element, the switching control circuit comprising:

a first discharge path connected to the control terminal of the target switching element for discharging the control terminal thereof, the first turn-off path having a first impedance;
a first switching element mounted on the first discharge path and configured to perform one of closing the first discharge path and opening the first discharge path;
a second discharge path connected to the control terminal of the target switching element for discharging the control terminal thereof, the second discharge path having a second impedance lower than the first impedance and being provided to address a first type of abnormality;
a second switching element mounted on the second discharge path and configured to perform one of closing the second discharge path and opening the second discharge path;
a third discharge path connected to the control terminal of the target switching element for discharging the control terminal thereof, the third discharge path having a third impedance higher than the first impedance and being provided to address a second type of abnormality different from the first type of abnormality;
a third switching element mounted on the third discharge path and configured to perform one of closing the third discharge path and opening the third discharge path;
a determiner that determines whether there is one of the first type of abnormality and the second type of abnormality in at least one of the target switching element and the switching control circuit; and
a controller that:
controls the second switching element to close the second discharge path when it is determined that there is the first type of abnormality;
disables closing of the third discharge path while the second discharge path is closed by the second switching element;
controls the third switching element to close the third discharge path when it is determined that there is the second type of abnormality; and
disables closing of the second discharge path while the third discharge path is closed by the third switching element.

2. The switching control circuit according to claim 1, wherein:
the target switching element has a predetermined threshold voltage and a predetermined on voltage, the threshold voltage representing, when a charged voltage of the control terminal of the target switching element reaches the threshold, the target switching element being turned on, the on voltage representing a voltage at the control terminal of the target switching element when the target switching element is in an on state; and
the first type of abnormality includes an intermediate-voltage abnormality, the intermediate-voltage abnormality representing an abnormality in which the voltage at the control terminal of the target switching element has been within a range between the threshold voltage and the on voltage inclusive for a preset period.

3. The switching control circuit according to claim 2, wherein the determiner detects the voltage at the control terminal of the target switching element, and determines that there is the intermediate-voltage abnormality when the voltage at the control terminal of the target switching element detected thereby has been within the range for the preset period.

4. The switching control circuit according to claim 1, wherein the controller:
- controls the third switching element to close the third discharge path for a second preset period when it is determined that there is the first type of abnormality;
- controls the third switching element to open the third discharge path after lapse of the second preset period; and
- controls the second switching element to close the second discharge path after lapse of the second preset period; and
- disables closing of the third discharge path while the second discharge path is closed by the second switching element.

5. A switching control circuit for controlling one of charge and discharge of a control terminal of a target switching element to perform a corresponding one of turn-on and turn-off of the target switching element, the switching control circuit comprising:
- a first discharge path connected to the control terminal of the target switching element for discharging the control terminal thereof, the first turn-off path having a first impedance;
- a first switching element mounted on the first discharge path and configured to perform one of closing the first discharge path and opening the first discharge path;
- a second discharge path connected to the control terminal of the target switching element for discharging the control terminal thereof, the second discharge path having a second impedance lower than the first impedance and being provided to address a first type of abnormality;
- a second switching element mounted on the second discharge path and configured to perform one of closing the second discharge path and opening the second discharge path;
- a third discharge path connected to the control terminal of the target switching element for discharging the control terminal thereof, the third discharge path having a third impedance higher than the first impedance and being provided to address a second type of abnormality different from the first type of abnormality;
- a third switching element mounted on the third discharge path and configured to perform one of closing the third discharge path and opening the third discharge path;
- a determiner that determines whether there is one of the first type of abnormality and the second type of abnormality in at least one of the target switching element and the switching control circuit;
- a first control unit that controls the second switching element to close the second discharge path when it is determined that there is the first type of abnormality;
- a first disabling unit that disables closing of the third discharge path while the second discharge path is closed by the second switching element;
- a second control unit that controls the third switching element to close the third discharge path when it is determined that there is the second type of abnormality; and
- a second disabling unit that disables closing of the second discharge path while the third discharge path is closed by the third switching element.

6. The switching control circuit according to claim 5, wherein: the target switching element has a predetermined threshold voltage and a predetermined on voltage, the threshold voltage representing, when a charged voltage of the control terminal of the target switching element reaches the threshold, the target switching element being turned on, the on voltage representing a voltage at the control terminal of the target switching element when the target switching element is in an on state; and the first type of abnormality includes an intermediate-voltage abnormality, the intermediate-voltage abnormality representing an abnormality in which the voltage at the control terminal of the target switching element has been within a range between the threshold voltage and the on voltage inclusive for a preset period.

7. The switching control circuit according to claim 6, wherein the determiner detects the voltage at the control terminal of the target switching element, and determines that there is the intermediate-voltage abnormality when the voltage at the control terminal of the target switching element detected thereby has been within the range for the preset period.

8. The switching control circuit according to claim 5, further comprises:
- a third control unit that controls the third switching element to close the third discharge path for a second preset period when it is determined that there is the first type of abnormality; and
- a fourth control unit that controls the third switching element to open the third discharge path after lapse of the second preset period, wherein:
the first control unit controls the second switching element to close the second discharge path after lapse of the second preset period; and
the first disabling unit disables closing of the third discharge path while the second discharge path is closed by the second switching element.

* * * * *